United States Patent
Yamada et al.

(10) Patent No.: US 9,607,807 B2
(45) Date of Patent: Mar. 28, 2017

(54) CHARGED PARTICLE BEAM EXPOSURE APPARATUS SUITABLE FOR DRAWING ON LINE PATTERNS, AND EXPOSURE METHOD USING THE SAME

(71) Applicant: ADVANTEST CORPORATION, Tokyo (JP)

(72) Inventors: Akio Yamada, Tokyo (JP); Tatsuro Okawa, Tokyo (JP); Masahiro Seyama, Tokyo (JP); Masaki Kurokawa, Tokyo (JP)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 14/878,713

(22) Filed: Oct. 8, 2015

(65) Prior Publication Data
US 2016/0133438 A1 May 12, 2016

(30) Foreign Application Priority Data
Nov. 12, 2014 (JP) .................. 2014-229726

(51) Int. Cl.
*H01J 37/00* (2006.01)
*H01J 37/304* (2006.01)
*H01J 37/317* (2006.01)
*H01J 37/20* (2006.01)

(52) U.S. Cl.
CPC ............ *H01J 37/304* (2013.01); *H01J 37/20* (2013.01); *H01J 37/3174* (2013.01); *H01J 2237/15* (2013.01); *H01J 2237/202* (2013.01); *H01J 2237/3175* (2013.01)

(58) Field of Classification Search
USPC .................. 250/492.1, 492.2, 492.22, 492.3
See application file for complete search history.

(56) References Cited

U.S. PATENT DOCUMENTS

| 7,276,714 B2 | 10/2007 | Platzgummer et al. |
| 2013/0216954 A1 | 8/2013 | Oishi et al. |
| 2014/0231668 A1 | 8/2014 | Yasuda |

FOREIGN PATENT DOCUMENTS

| JP | 2011-258842 | 12/2011 |
| JP | 2013-016744 | 1/2013 |
| JP | 2013-093567 | 5/2013 |
| JP | 2013-0172106 | 9/2013 |

*Primary Examiner* — Nicole Ippolito
*Assistant Examiner* — Hanway Chang
(74) *Attorney, Agent, or Firm* — Muramatsu & Associates

(57) ABSTRACT

There is provided a charged particle beam exposure apparatus which turns an array beam including a plurality of charged particle beams, being arranged side by side in a line in a direction intersecting line patterns, on and off at predetermined blanking timing, and thus performs irradiation when irradiated positions of the charged particle beams arrive at pattern positions. The charged particle beam exposure apparatus improves data processing control by segmenting a sample provided with line patterns into a plurality of exposure ranges each at a predetermined length in a direction of movement, and performing on-off control of the beams based on a point of time when the array beam passes on a reference position set in the exposure region.

13 Claims, 18 Drawing Sheets

CHARGED PARTICLE BEAM EXPOSURE APPARATUS SUITABLE FOR DRAWING ON LINE PATTERNS, AND EXPOSURE METHOD USING THE SAME

CROSS-REFERENCE TO RELATED APPLICATIONS

This application is based upon and claims the benefit of priority of the prior Japanese Patent Application No. 2014-229726, filed on Nov. 14, 2014, the entire contents of which are incorporated herein by reference.

FIELD

The embodiments discussed herein are related to a charged particle beam exposure apparatus and an exposure method using the same.

BACKGROUND

With the recent progress in integration of semiconductor devices, there has been a demand for exposure techniques capable of forming finer patterns, and development of new exposure techniques is therefore in progress. Light exposure techniques now in use include one which employs light from an ArF light source. However, the light from the ArF light source has a long wavelength and therefore has a difficulty in forming patterns with a line width equal to or below 20 nm even when various resolution improvement techniques are used in combination.

An exposure technique using a charged particle beam including an electron beam has an essential advantage that its resolution is high because a diffracted wavelength of the charged particle beam is extremely short. On the other hand, the exposure technique using the charged particle beam faces a problem of how to improve its processing speed.

Given this situation, there has been proposed complementary lithography which utilizes the light exposure technique and the charged particle beam exposure technique in a complementary manner.

In the complementary lithography, simple line-and-space patterns are produced by using the light exposure. Line-and-space patterns with a line width equal to or below 10 nm can be formed by the light exposure while using a resolution improvement technique such as double patterning in combination therewith.

Subsequently, exposure for forming cut patterns to cut the line patterns and forming via-hole patterns to connect line patterns to other line patterns on a different layer is performed by the charged particle beam exposure.

In the complementary lithography, the area of a resist pattern for performing the exposure using the charged particle beam is limited to about several percent of the area of the entire pattern. For this reason, the complementary lithography requires a significantly smaller amount of charged particle beam irradiation per wafer as compared to the case of subjecting the entire region of the pattern to the exposure by using the charged particle beam only.

Accordingly, the complementary lithography has a potential to dramatically improve a processing speed while taking advantage of the high resolution to available from the charged particle beam exposure.

Another possible option is to use a plurality of charged particle beams in order to perform efficient exposure for forming the cut patterns and the via-hole patterns on the line patterns.

Nonetheless, there is no known method of efficiently performing the exposure for forming the cut patterns and the via-hole patterns laid out on arbitrary positions on the line patterns.

The above noted conventional technologies are described in, for example, U.S. Pat. No. 7,276,714 and Japanese Laid-open Patent Publication No. 2013-093567.

SUMMARY OF INVENTION

An aspect of the following disclosure provides a charged particle beam exposure apparatus configured to irradiate a substrate including a plurality of line patterns with a charged particle beam and to perform exposure of a pattern on the line patterns. Here, the charged particle beam exposure apparatus includes: a stage unit capable of holding the substrate and moving the substrate at least in an extending direction of the line patterns; a column unit configured to generate an array beam including a plurality of charged particle beams; a blanker array included in the column unit and configured to turn each charged particle beam included in the array beam on or off based on a blanking operation signal; and an exposure control unit configured to control a position of the array beam in such a way as to retain the charged particle beams on the line patterns, and to control the blanker array in such a way as to turn each charged particle beam on and off at timing when the charged particle beam arrives at a pattern formation position.

The charged particle beam exposure apparatus of this aspect can perform the exposure for forming cut patterns and via-hole patterns laid out at arbitrary positions on the line patterns by turning each charged particle beam on and off at the timing when the charged particle beam arrives at the pattern formation position. Moreover, since the plurality of charged particle beams can be used at the same time, it is possible to efficiently perform the exposure on the multiple line patterns.

DESCRIPTION OF EMBODIMENTS

Embodiments will be described below with reference to the accompanying drawings. Note that in the following description, an electron beam exposure apparatus using electron beams will be explained as an example of a charged particle beam exposure apparatus. However, the embodiments are not limited only to the electron beam exposure apparatus, but are also applicable to charged particle beam apparatuses which employ various particles other than the electron beams as the charged particle beams.

Figure 1:
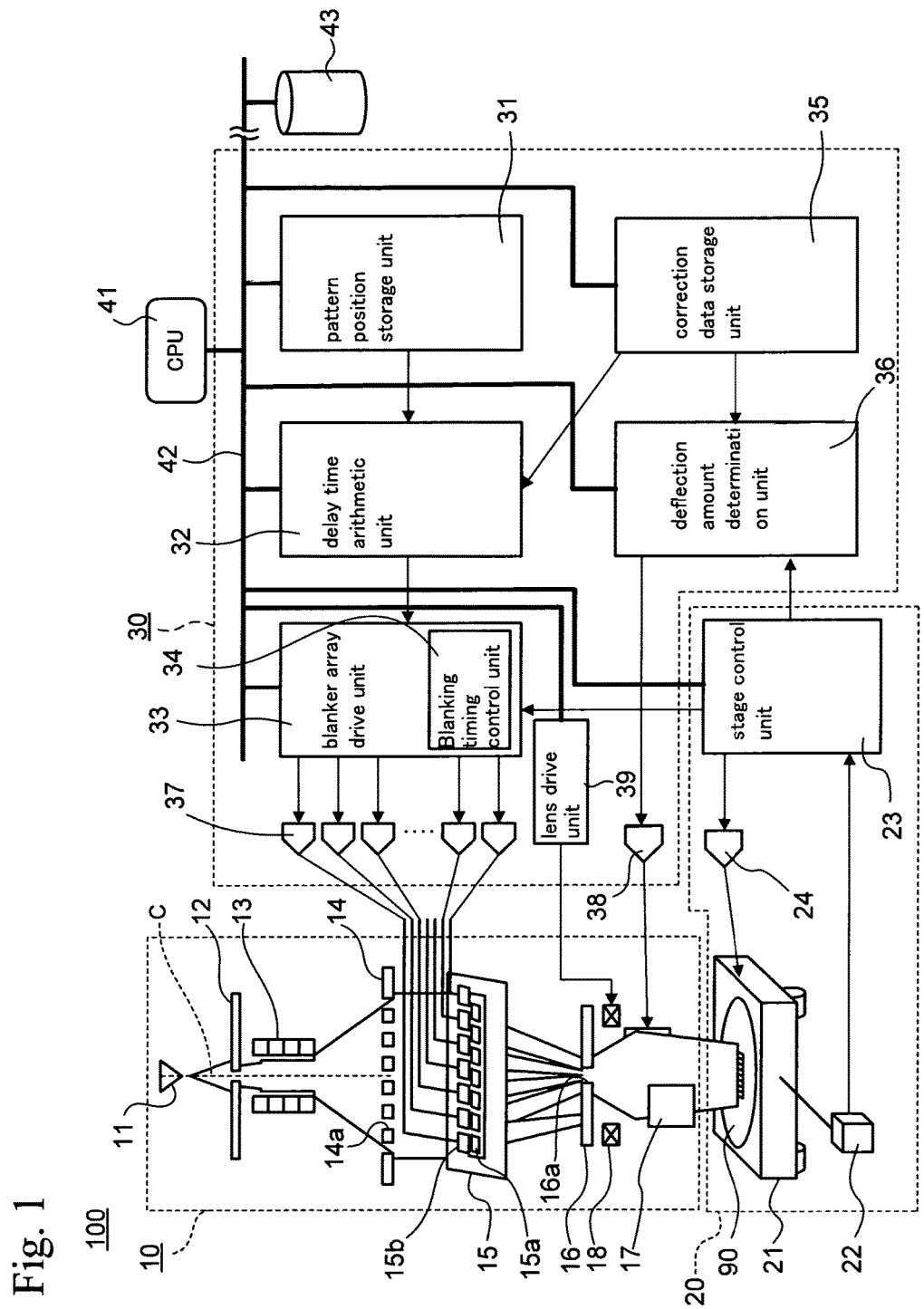
FIG. 1 is a block diagram of a charged particle beam exposure apparatus according to a first embodiment.

FIG. 1 is a block diagram of a charged particle beam exposure apparatus according to a first embodiment.

A charged particle beam exposure apparatus 100 shown in FIG. 1 is an electron beam exposure apparatus of a single column type provided with a single column unit 10. An exposure control unit 30 configured to control the column unit 10 is connected to the column unit 10. A stage unit 20 is provided below the column unit 10. The column unit 10 and the stage unit 20 are housed in a vacuum chamber.

The column unit 10 includes an electron gun 11. An electron beam accelerated with a predetermined acceleration voltage (such as 50 KeV) is emitted from the electron gun 11. A first aperture 12 is provided below the electron gun 11. The electron beam once spread in a predetermined angular range with respect to an optical axis c is cut out by the first aperture 12, and is thus shaped into the electron beam with a circular cross section.

A beam cross-sectional shape deformation element 13 is disposed below the first aperture 12. The beam cross-sectional shape deformation element 13 includes a plurality of stages of electrostatic quadrupole electrodes, for example. The beam cross-sectional shape deformation element 13 transforms the electron beam with the circular cross section shaped by the first aperture 12 into a cross-sectional shape elongated in one direction. The electron beam with the elongated cross-sectional shape is projected onto an aperture array 14.

A plurality of openings 14a are formed side by side in a line at a constant pitch in the aperture array 14. The electron beam having the elongated cross-sectional shape is projected onto the group of openings arranged side by side in the unidimensional direction. Then, a plurality of electron beams are formed by cutting out the original electron beam with the openings 14a of the aperture array 14.

As described above, in the charged particle beam exposure apparatus 100 of this embodiment, the electron beam is shaped into the elongated cross section by using the beam cross-sectional shape deformation element 13, and is then projected onto the aperture array 14 extending in the unidimensional direction. Thus, the electron beam emitted from the electron gun 11 can be transformed into the plurality of electron beams without waste. Accordingly, utilization efficiency of the original electron beam is increased and the transformed electron beams each at a high current density can be obtained.

The plurality of electron beams thus created by the aperture array 14 are arrayed side by side in the unidimensional direction. Such a group of the electron beams will be hereinafter collectively referred to as an array beam.

A blanker array 15 is provided below the aperture array 14. The blanker array 15 is formed from a silicon substrate, for example, and is provided with openings 15a at portions corresponding to the positions of the respective electron beams constituting the array beam. An electrode pair 15b is formed beside each opening 15a. A trajectory of each electron beam passing through the corresponding opening 15a can be individually changed by an electric field generated by the electrode pair 15b.

A final aperture 16 including an opening 16a is provided below the blanker array 15.

The array beam passing through the blanker array 15 is focused on the opening 16a of the final aperture 16 by use of a not-illustrated electro-optical system.

An electron beam deflected by the blanker array 15 is projected on the outside of the opening 16a and is thus blocked by the final aperture 16 (an off state). Meanwhile, an electron beam not deflected by the blanker array 15 passes through the opening 16a of the final aperture 16 and is guided to the stage unit 20 (an on state).

Thus, the blanker array 15 can switch on and off of each electron beam included in the array beam.

The electron beam having passed through the final aperture 16 is subjected to fine adjustment of its irradiated position by a feedback deflector 17 disposed below the final aperture 16. The electron beam is further subjected to convergence by a group of electromagnetic lenses 18 disposed above and below the feedback deflector 17, and is thus focused and projected onto a predetermined position of a sample 90 on the stage unit 20.

Here, the group of electromagnetic lenses 18 can adjust a turning angle of the array beam unidimensionally arranged side by side, in addition to the focus adjustment, by appropriately adjusting a combination of lens intensities thereof (intensities of magnetic fields generated by electromagnetic coils therein). Usually, the longitudinal direction of the array beam is set to a direction orthogonal to a direction of continuous movement of the stage, by conducting adjustment work at a start of or before the exposure by the charged particle beam exposure apparatus 100.

The stage unit 20 located below the column unit 10 will be described.

The stage unit 20 is provided with a stage apparatus 21 which includes a drive mechanism. The irradiated position of the electron beam on the sample 90 can be moved by holding and moving the sample 90 with the stage apparatus 21. A laser displacement gauge 22 configured to detect displacement of the stage apparatus 21 is provided beside the stage apparatus 21.

An output from the laser displacement gauge 22 is sent to a stage control unit 23 provided to the stage unit 20. The stage control unit 23 detects the irradiated position of the array beam on the sample 90 based on a signal from the laser displacement gauge 22, and outputs a detection result to the exposure control unit 30. Further, the stage control unit 23 outputs a feedback control signal to a stage driver circuit 24 so as to keep a moving velocity of the stage apparatus 21 constant. Based on the feedback control signal, the stage driver circuit 24 outputs a predetermined drive signal to the stage apparatus 21.

Figure 2:
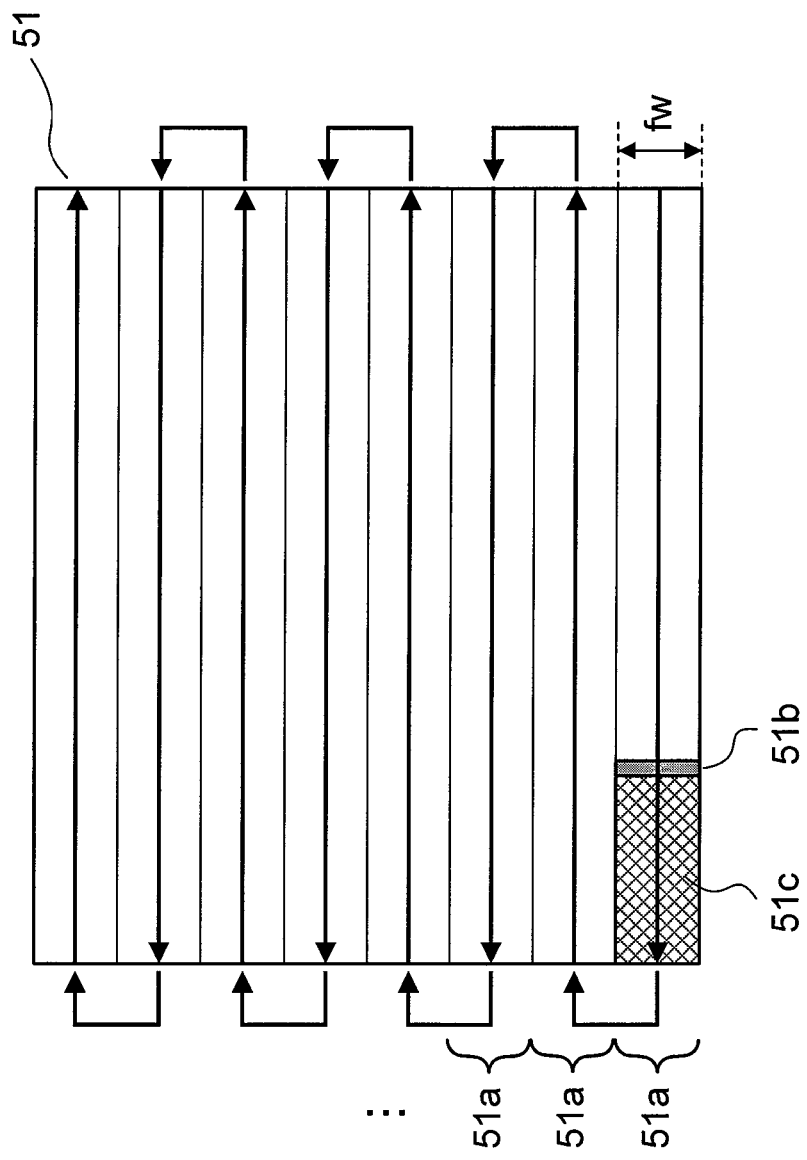
FIG. 2 is a plan view showing a movement sequence of a stage of the charged particle beam exposure apparatus in FIG. 1.

FIG. 2 is a plan view showing a movement route of the stage apparatus 21 of the charged particle beam exposure apparatus 100 in FIG. 1.

A rectangular region 51 assigned to the column shown in FIG. 2 represents a region on the sample (a semiconductor wafer) 90 on which the single column unit 10 performs the exposure. Although the region 51 assigned to the column is not limited to a particular size, the region 51 is set to such a size which can cover the majority of the area of the wafer in the case of the charged particle beam exposure apparatus 100 of the single column type, for example. On the other hand, in the case of an electron beam exposure apparatus of a multiple column type provided with a plurality of columns, the size of the region 51 assigned to the column may be defined, for example, as a 30-mm square shape having each side almost equal to a diameter (30 mm) of each column unit 10.

At the time of performing the exposure, the stage apparatus 21 is continuously moved forward and backward in a direction indicated with any of lateral arrows of FIG. 2 while keeping a constant velocity, and is caused to cross the region 51 assigned to the column. An exposure position 51b of the array beam moves along with the continuous movement of the stage apparatus 21. Hence, the exposure in a strip-shaped exposed region 51c is achieved by one session of forward or backward movement. The region subjected to the exposure by the one session of forward or backward movement corresponds to a strip-shaped region having a width equal to a length fw (such as 30 μm) of the array beam. In this specification, the aforementioned strip-shaped region will be referred to as a frame 51a.

Thereafter, the stage apparatus 21 is moved upward just by a distance equivalent to one frame (such as 30 μm). Then, the exposure in the next frame 51a is performed while continuously moving the stage apparatus 21 again in the forward and backward direction.

The exposure in the region 51 assigned to the column is performed by repeating the sessions of the reciprocating movement as described above.

A main structure of a control system of the charged particle beam exposure apparatus 100 of FIG. 1 will be described below on the basis of the aforementioned operation of the stage apparatus 21.

One exposure control unit 30 is provided for one column unit 10. The exposure control unit 30 conducts the control of components of the column unit 10. The exposure control unit 30 is operated on the basis of a control signal from a central control unit 41 sent via a bus 42, and of exposure data from an external exposure data accumulation unit 43.

The exposure data from the external exposure data accumulation unit 43 are sent to a pattern position storage unit 31 of the exposure control unit 30. The exposure data are stored in the external exposure data accumulation unit 43 in a format obtained by organizing pieces of data, each of which records position coordinates of a pattern on a wafer as well as exposure time for each frame 51a.

The pattern position storage unit 31 of this embodiment stores the exposure data in each frame 51a by dividing the exposure data into units of exposure ranges each with a predetermined length obtained by segmenting the exposure data in the frame 51a into smaller pieces in the direction of movement of the stage.

Then, the exposure data of the corresponding exposure range is forwarded to a delay time arithmetic unit 32 at predetermined timing.

The delay time arithmetic unit 32 obtains timing (delay time) to turn the electron beam on or off from position data of a pattern and from the moving velocity of the stage apparatus 21. Then, the delay time arithmetic unit 32 calculates time to turn each electron beam on or off as a delay time which is defined as a time when the array beam passes through a reference position set on a boundary between one exposure region and another exposure region as a starting point.

Meanwhile, the delay time arithmetic unit 32 receives exposure correction time data corresponding to the intensity of each of the electron beams constituting the array beam as well as position correction data of the pattern based on the tilt of the pattern from a correction data storage unit 35. Then, the delay time arithmetic unit 32 performs processing for reflecting corrections for the intensities of the electron beams, the tilt of the array beam, and the like in the delay time.

The delay time calculated by the delay time arithmetic unit 32 is sent to a blanker array drive unit 33. A blanking timing control unit 34 is included in the blanker array drive unit 33. The blanking timing control unit 34 acquires a current position of the stage apparatus 21 via the stage control unit 23. Then, the blanking timing control unit 34 detects the timing when the array beam passed through the reference point, and performs the control of the timing for blanking each electron beam on or off starting from the delay time based on the aforementioned timing. Thus, the blanker array drive unit 33 outputs a blanking control signal at the delay time set to each of the electron beams.

The signals outputted from the blanker array drive unit 33 are amplified by blanking amplifiers 37 and outputted to the electrode pairs 15b of the blanker array 15.

A deflection amount determination unit 36 conducts correction of a positional displacement component in the direction orthogonal to the direction of movement of the stage apparatus 21. By using the deflection amount determination unit 36, the exposure position 51b of the array beam is fine-tuned in the direction (the vertical direction of FIG. 2) orthogonal to the direction of continuous movement of the stage apparatus 21. Thus, the position of each electron beam included in the array beam is held on the line pattern.

To achieve the above-described control, the deflection amount determination unit 36 acquires the positional displacement of the stage apparatus 21 and the position of the sample 90 obtained in advance by an observation of a positioning marker, from the correction data storage unit 35. Then, the deflection amount determination unit 36 calculates a correction amount for aligning the array beam on the line patterns as an object of exposure. Meanwhile, the deflection amount determination unit 36 calculates the tilt of the array beam by using tilt of the sample 90, and determines a deflection amount so as to cause the array beam to follow on the line patterns in accordance with the movement of the stage apparatus 21.

Furthermore, the deflection amount determination unit 36 converts the determined deflection amount into a corresponding deflection control signal, and then outputs the deflection control signal to the feedback deflector 17 via a deflector drive circuit 38.

A lens drive unit 39 of the exposure control unit 30 adjusts the turning (rotation) angle as well as a focus of the array beam by adjusting the combination of lens intensities of the group of electromagnetic lenses 18.

Now, exposure for cut patterns using the above-mentioned charged particle beam exposure apparatus 100 will be described below.

Figure 3:
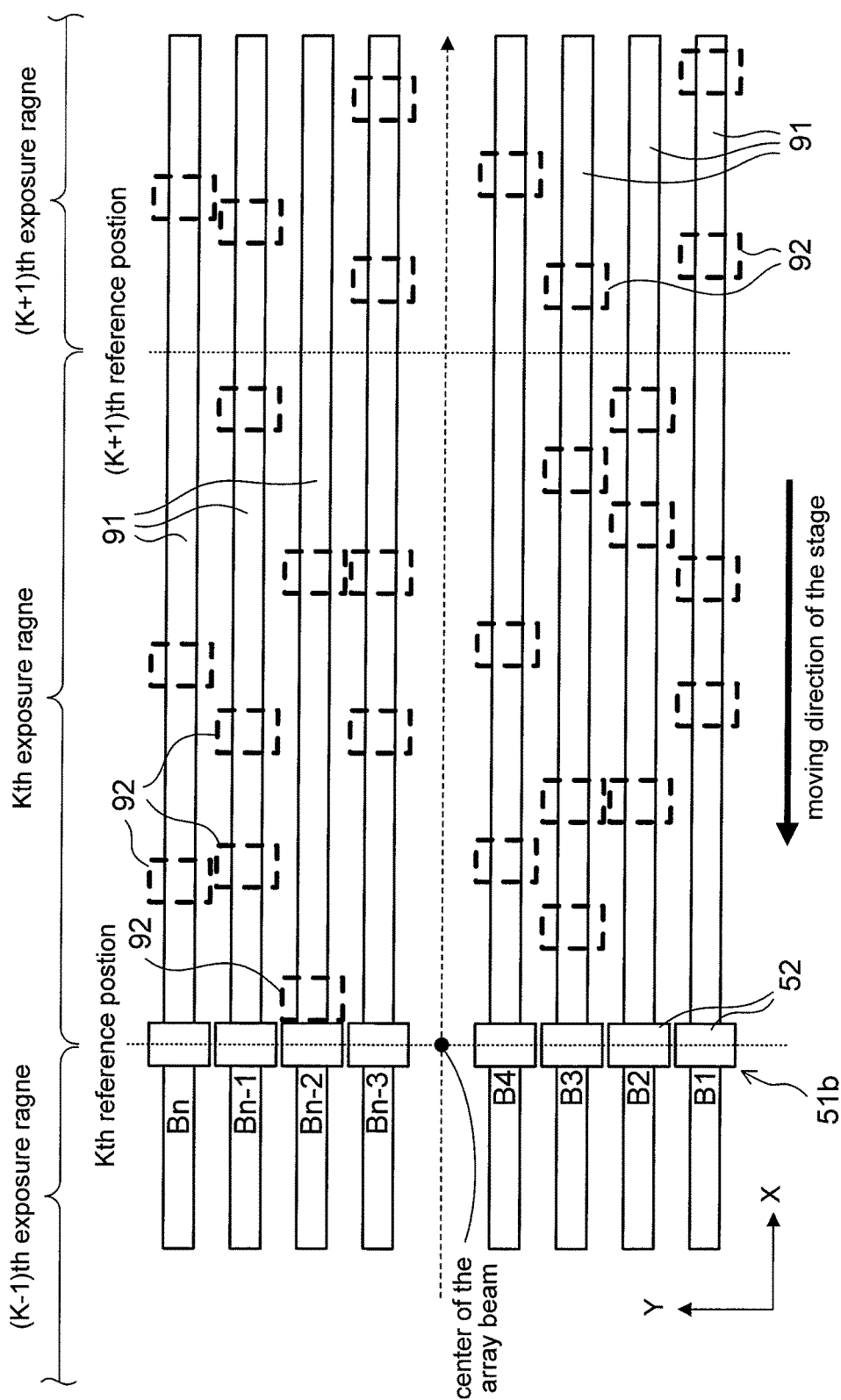
FIG. 3 is an enlarged view of an exposure position in FIG. 2.

FIG. 3 is an enlarged view showing the vicinity of the exposure position 51b in FIG. 2.

In FIG. 3, rectangles 52 represent irradiated positions of electron beams B1 to Bn collectively constituting the array beam. As shown in FIG. 3, an irradiated position 52 of each of the electron beams B1 to Bn moves on a line pattern 91 under control of the feedback deflector 17. Here, position alignment of the line pattern 91 with the electron beam is performed based on a result of observation of a positioning mark on the semiconductor wafer as the object of exposure.

Then, the exposure for the cut patterns is performed by setting each of the electron beams constituting the array beam to an on state for a predetermined period at timing when the irradiated position 52 of the electron beam reaches a drawing position 92 of a predetermined cut pattern.

Although positional accuracy for the pattern as an object to be drawn varies with its process node, accuracy in the order of several nanometers is required. Accordingly, assuming that the length of one frame is in a range from about 30 mm to 300 mm, for example, an enormous number of data bits are required when the position coordinates of the patterns are managed as a whole. As a consequence, the control unit 30 may be overloaded.

Accordingly, in the charged particle beam exposure apparatus 100 of this embodiment, the pattern position storage unit 31 and the delay time arithmetic unit 32 divide the exposure data for one frame 51a into a plurality of exposure ranges each with a certain length, namely, into exposure data pieces for a first exposure range, a second exposure range, . . . , and a k-th exposure range. The length of each exposure range may be set to such a length, with which the number of bits of the corresponding exposure data piece does not become too large, or about 0.2 μm, for example.

In addition, an exposure reference position is set to each of the exposure ranges as a reference point for exposure timing in each of the exposure ranges. Specifically, a first reference position, a second reference position, . . . , and a k-th reference position are set to the first exposure range, the second exposure range, . . . , and the k-th exposure range, respectively. Although it is not particularly limited, in this embodiment, the exposure reference position is set to a position at a starting end of each exposure range and at the center in the width direction of the frame 51a. This exposure reference position is also a position of the exposure range at which the center of the array beam arrives first.

Here, the starting end of the exposure range corresponds to a left end of the exposure range when the array beam moves on the frame 51a to the right, or corresponds to a right end of the exposure range when the array beam moves on the frame 51a to the left. In other words, the location of the reference position of the exposure range changes depending on whether the array beam moves to the right or to the left.

Next, the pattern position storage unit 31 (FIG. 1) acquires pattern position data of the exposure ranges from the external exposure data accumulation unit 43, and supplies the pattern position data to the delay time arithmetic unit 32 at predetermined timing.

Thereafter, the delay time arithmetic unit 32 calculates the delay time for turning the electron beams on or off. Based on the delay time, the blanker array drive unit 33 and the blanking amplifiers 37 are operated to perform the on-off control of the electron beams.

The control operations by the delay time arithmetic unit 32 and the blanker array drive unit 33 will be further described below.

Figure 4:
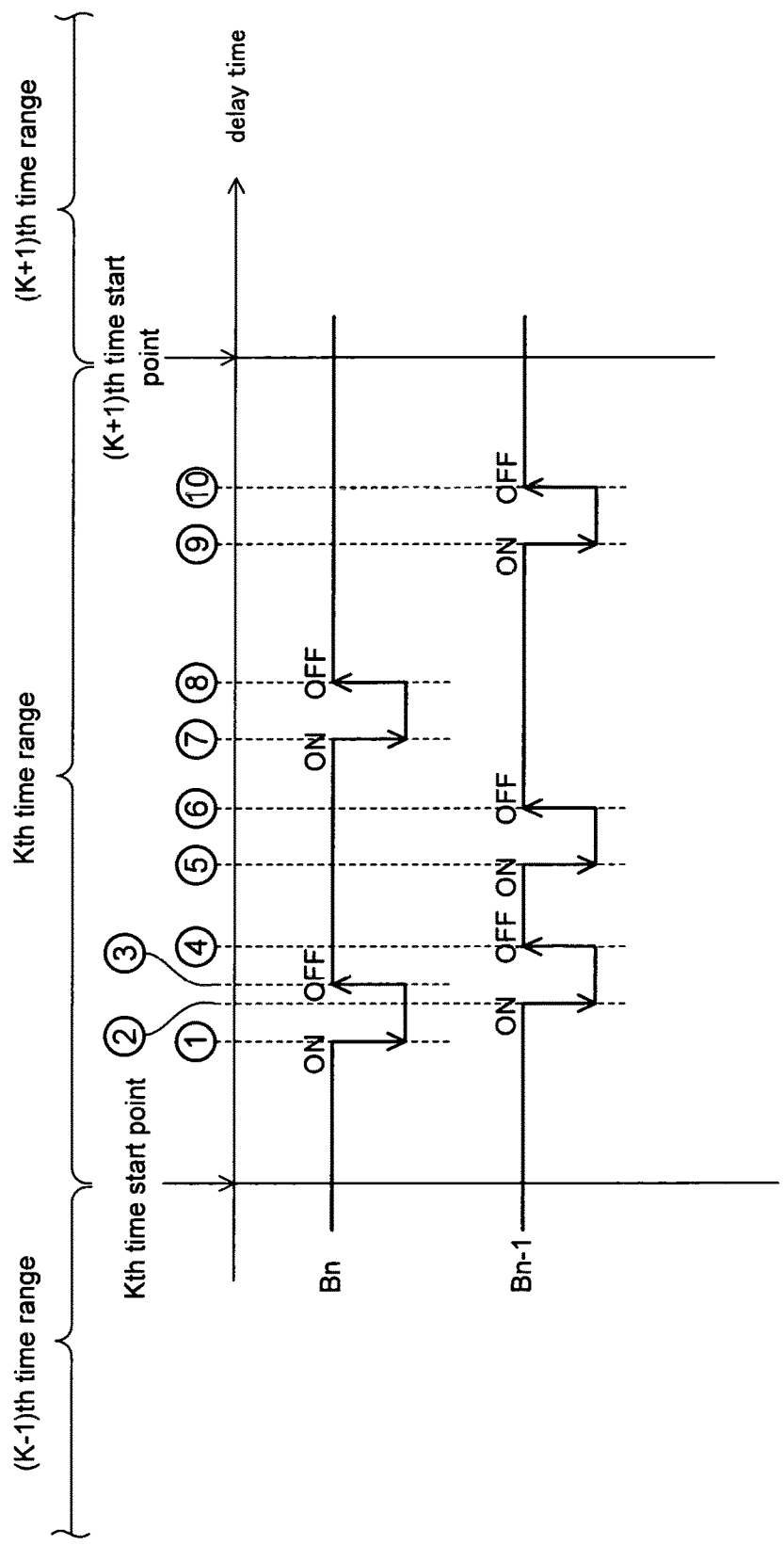
FIG. 4 is a timing chart showing blanking signals for individual charged particle beams.

FIG. 4 is a timing chart showing an example of blanking operations for the electron beams. The description will be hereinbelow given while focusing on the electron beams Bn and Bn−1 in the case of exposure in the k-th exposure range.

A k-th time starting point in FIG. 4 represents a point of time when the center of the array beam passes through the exposure reference position of the k-th exposure range.

By setting the k-th time starting point as the starting point, the delay time arithmetic unit 32 calculates time (the delay time) when each of the beams Bn−1 and Bn belonging to the array beam is operated to be turned on or off.

The delay time is obtained on the basis of the following relational expressions in which the moving velocity of the stage apparatus is defined as V, the exposure reference position in FIG. 3 is defined as S, the center position of the pattern to be subjected to the exposure is defined as Cp, and the width of the pattern (a length in an X direction) is defined as Wp.

Specifically, the delay time (TDLon) regarding the control to turn the electron beam on is obtained by the following relational expression:

$$TDLon=(Cp-Wp/2-S)/V.$$

Meanwhile, the delay time (TDLoff) regarding the control to turn the electron beam off is obtained by the following relational expression:

$$TDLoff=(Cp+Wp/2-S)/V.$$

Regarding the electron beam Bn, for example, the delay time concerning the control to turn the electron beam Bn on is set to each of time segments indicated with "1" and "7". Meanwhile, the delay time concerning the control to turn the electron beam Bn off is set to each of time segments indicated with "3" and "8".

Regarding the electron beam Bn−1, the delay time concerning the control to turn the electron beam Bn−1 on is set to each of time segments indicated with "2", "5", and "9". Meanwhile, the delay time concerning the control to turn the electron beam Bn−1 off is set to each of time segments indicated with "4", "6", and "10".

Thus, the delay time arithmetic unit 32 obtains the delay time for performing the exposure of the patterns which belong to the k-th exposure range in terms of all the electron beams B1 to Bn constituting the array beam.

The delay time arithmetic unit 32 obtains the above-described delay time at the timing before the start of a k-th time range when the exposure concerning the k-th exposure range takes place.

Next, the delay time arithmetic unit 32 sets the delay time set as described above to the blanker array drive unit 33.

Now, the control of the delay time by the blanker array drive unit 33 will be described below.

Figure 5:
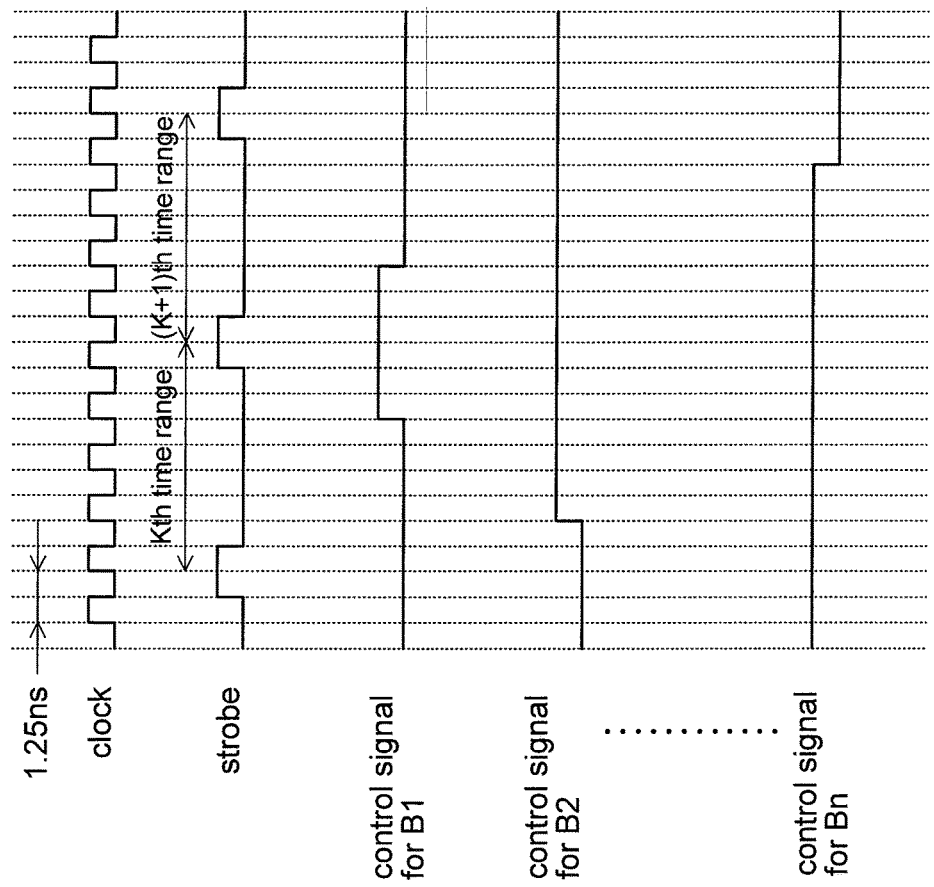
FIG. 5 is a timing chart showing a method of controlling the blanking signals.

FIG. 5 is a timing chart showing the control of the delay time by the blanker array drive unit 33. Although a reference clock period which governs temporal resolution is set to 1.25 ns in the example of FIG. 5, the reference clock period is not particularly limited to this value.

As shown in FIG. 5, the blanking timing control unit 34 of the blanker array drive unit 33 is operated on the basis of a reference clock signal at a clock cycle of 1.25 ns, and of a strobe signal.

The strobe signal is a signal, of which a high state is outputted at the timing when the center of the array beam passes through any of the exposure reference positions based on the detection result by the laser displacement gauge 22. Thus, the strobe signal indicates time starting points.

The clock cycle is set as appropriate depending on desired positional resolution and the stage velocity. Although it is not particularly limited, when a data step of exposure positions is 0.125 nm, the positional resolution is preferably set to a half of the data step, i.e., 0.0625 nm. Assuming that a maximum moving velocity Vmax of the stage is 50 mm/sec, the reference clock cycle is obtained by the following formula:

0.0625 [nm]/50 [mm/s]=1.25 [ns](=800 MHz).

Accordingly, the number of clocks necessary to designate the delay time of 0.32 μs is equal to 256 clocks, while the number of clocks necessary to set the delay time of 1.28 μs is equal to 1024 clocks.

Based on the length (0.2 μm) of the exposure region, the delay time of 4 μs needs to be designated at most. As a consequence, the size of timing data in one time range remains within 12 bits.

In the meantime, the number of the electron beams (around 4000, for example) belonging to the array beam can be identified by use of bit numbers composed of 12 bits (=4096) at the maximum. Here, it is possible to omit a blanking operation signal for an electron beam which is not assigned to the blanking operation. Accordingly, the blanking operation signals need to be transferred only in terms of the electron beams for which the blanking electrodes 15b are to be switched on and off.

At a time interval of about 0.2 μs, the blanking operation signals are transferred so as to cover about 12% of the total number of beams of the array beam. In this case, the required data rate is calculated by 12×4096×0.12/0.2, which is equal to about 29.5 Gbps.

As described above, the charged particle beam exposure apparatus 100 of this embodiment controls the timing to turn each electron beam on or off based on the point of time when the electron beam passes through the boundary of the exposure ranges segmented into pieces with the predetermined length. Thus, it is possible to suppress the number of bits of control data and to improve operating speeds of the control units.

Second Embodiment

This embodiment will describe a method of correcting the exposure position when the line pattern is tilted with respect to the direction of movement of the stage. Note that the configuration of the charged particle beam exposure apparatus 100 used for exposure in this embodiment is the same as that of the first embodiment, and its description will therefore be omitted.

Figure 6:
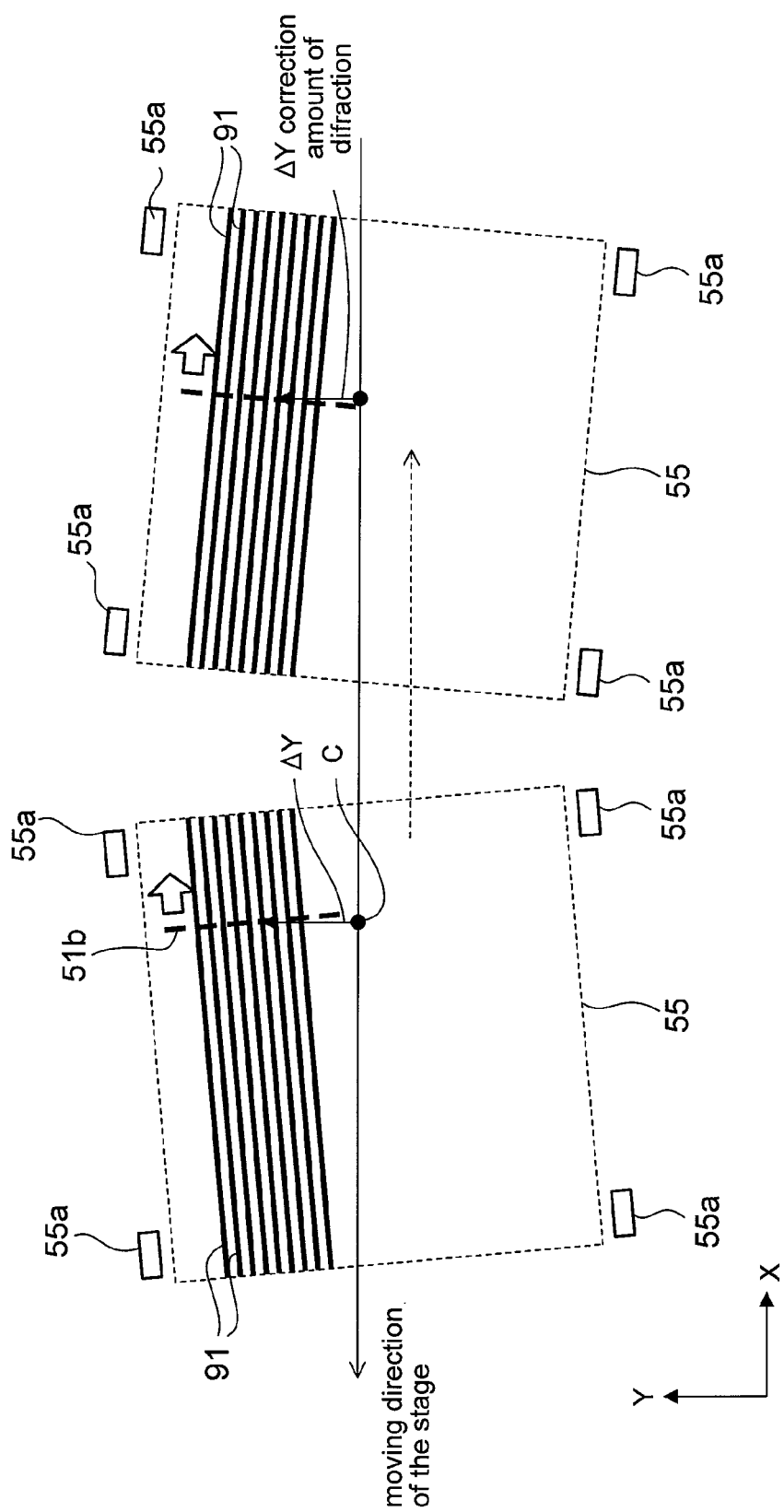
FIG. 6 is a plan view showing positional displacement of chips mounted on a substrate.

FIG. 6 is a view showing a problem in the case where a plurality of semiconductor chips are disposed in one region 51 assigned to the column and the exposure is performed across the plurality of semiconductor chips with the movement for one frame.

As shown in FIG. 6, if a semiconductor chip 55 as an object of exposure is smaller than the one region assigned to the column, then it is possible to dispose a plurality of semiconductor chips 55 in the region 51 assigned to the column and to perform the exposure thereon at the same time.

In this case, the positions and angles of the line patterns may vary among the semiconductor chips due to layout displacement of the semiconductor chips 55. For this reason, the irradiated positions of the electron beams need to be corrected.

Accordingly, positional displacement and turning displacement of each chip are detected before the exposure in this embodiment by detecting positions of chip marks (positioning marks) 55a formed around each semiconductor chip 55. A detection result is stored in the correction data storage unit 35 (see FIG. 1).

Next, the deflection amount determination unit 36 of the charged particle beam exposure apparatus 100 obtains a positional displacement component in the direction orthogonal to the direction of movement of the stage apparatus 21 based on the positional displacement and the turning (rotation) displacement of each chip. Then, a deflection correction amount is set depending on the size of the positional displacement. The deflection correction amount thus set is outputted to the feedback deflector 17 via the deflector drive circuit 38, whereby the correction of the positional displacement component in the direction orthogonal to the direction of movement of the stage is performed. Thus, the position of each of the electron beams constituting the array beam can follow the corresponding line pattern 91.

Next, a positional displacement component in the direction of movement of the stage apparatus 21 due to the tilt of the semiconductor chip is corrected. This correction is performed as correction of the delay time obtained in the first embodiment.

Figure 7:
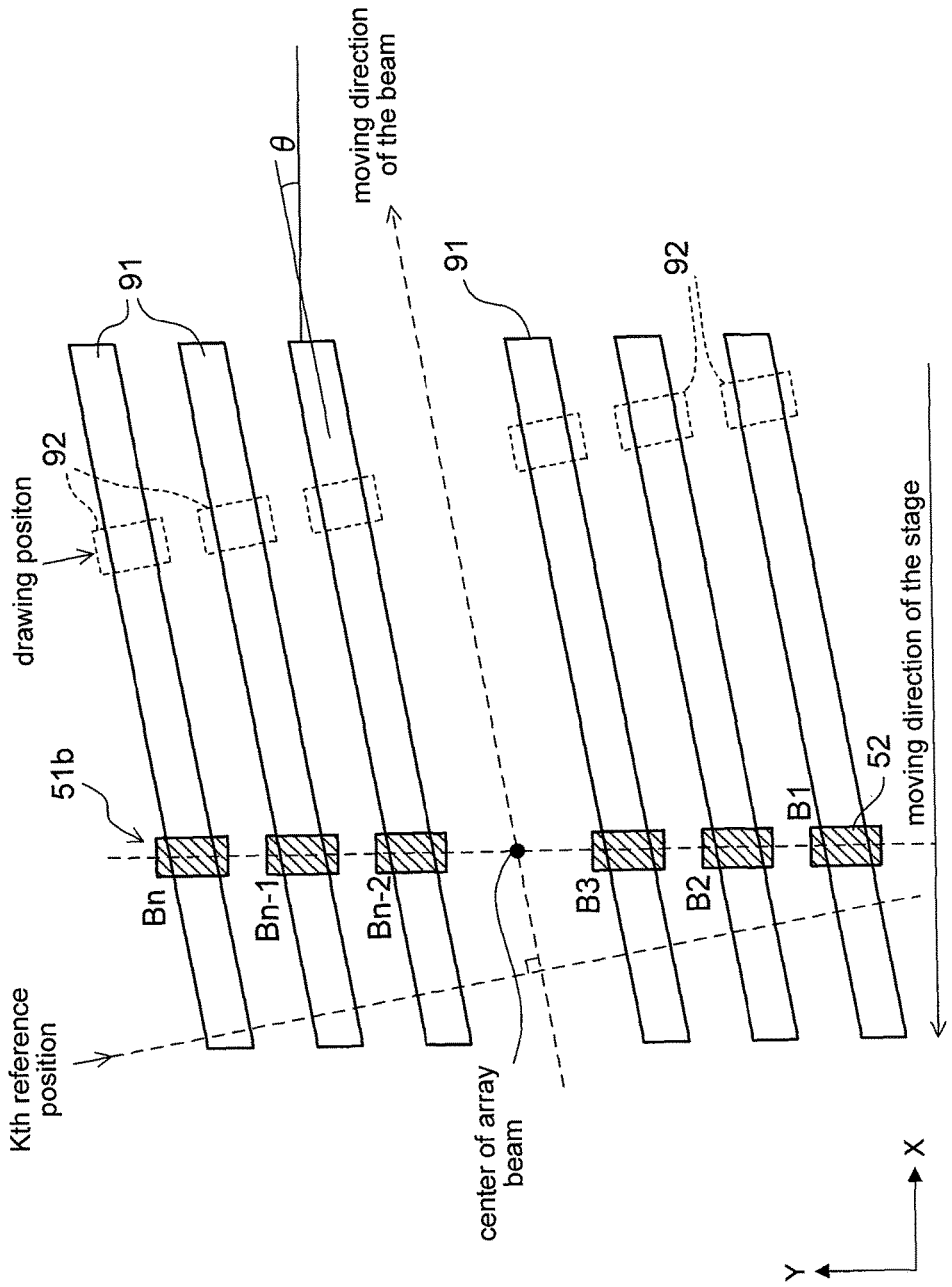
FIG. 7 is a plan view showing positional displacement due to tilt of line patterns.

FIG. 7 is a plan view showing the positional displacement in the direction of movement of the stage apparatus 21 due to the tilt of the line patterns 91.

As shown in FIG. 7, when the line patterns 91 are tilted with respect to the direction of movement of the stage, there occurs a difference in time of arrival at the drawing position 92 between the beam B1 on the lower side of the array beam and the beam Bn on the upper side thereof. When a length in a longitudinal direction of the array beam is set to 30 μm, for example, if the line patterns 91 are tilted with respect to the direction of movement of the stage by 1 mrad, then the positional displacement equal to about 15 mm in the direction of movement of the stage apparatus 21 occurs between the upper end and the lower end of the array beam.

In this embodiment, the correction of the positional displacement in the direction of movement of the stage due to the tilt of the line patterns 91 is performed by adjusting the delay time using the delay time arithmetic unit 32.

Figure 8:
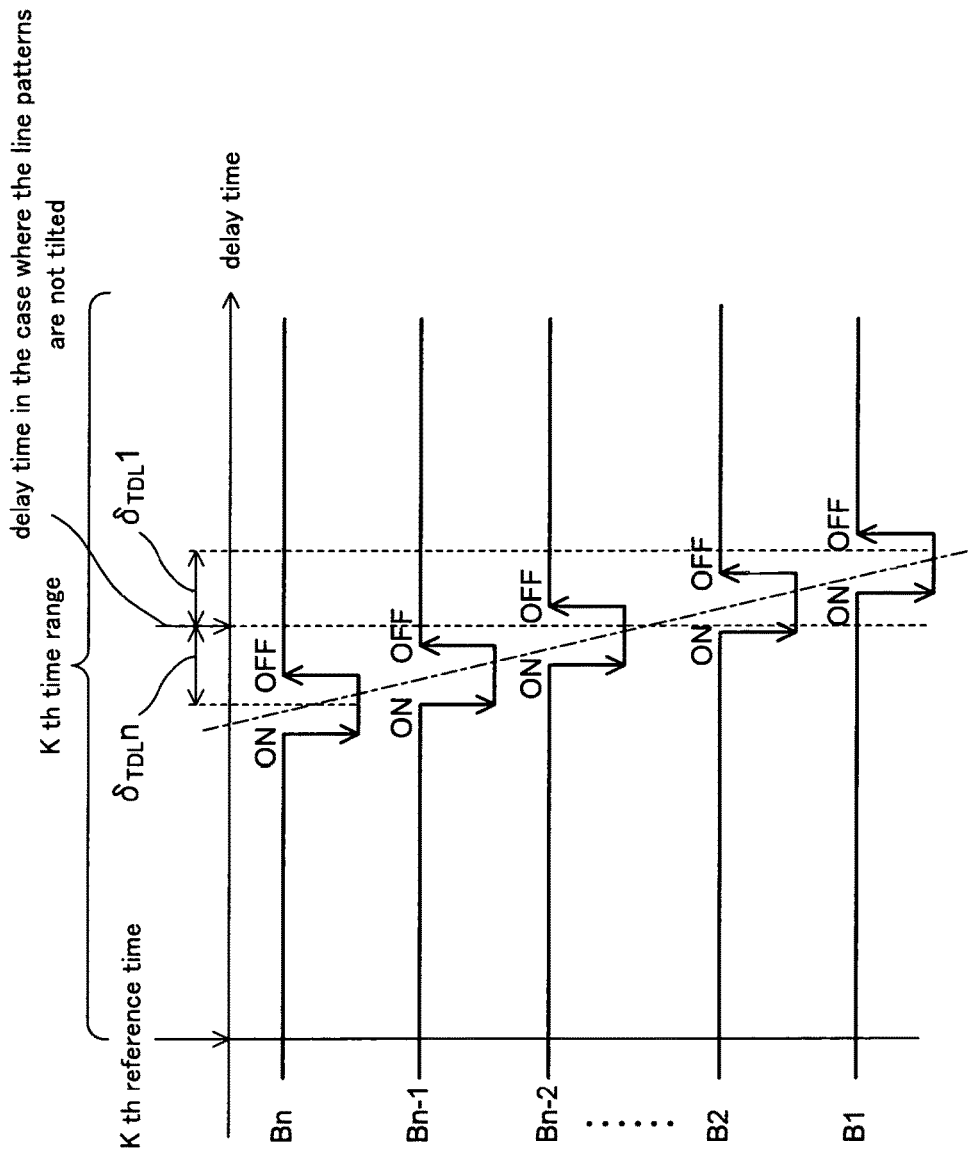
FIG. 8 is a diagram showing a method of correcting delay time corresponding to the tilt of the line patterns.

FIG. 8 is a diagram showing a method of correcting the delay time for each of the electron beams of the array beam in order to correct the positional displacement attributed to the tilt of the line patterns 91.

As shown in FIG. 8, the size of the positional displacement in the direction of movement of the stage apparatus 21 relative to the center position of the array beam is obtained in terms of each of the beams B1 to Bn based on tilt data of the line patterns 91. Then, differences $\delta_{TDL1}$, $\delta_{TDL2}$, . . . $\delta_{TDLn}$ in arrival time of the beams are obtained by dividing the positional displacement amounts by the moving velocity of the array beam. For example, when the moving velocity of the array beam is equal to 30 mm/s and the positional displacement of the beam B1 relative to the center of the array beam is 15 nm, the value $\delta_{TDL1}$ is obtained by −15 [nm]/30 [nm/s]=0.5 [μs].

A correction amount δ thus obtained is added to the delay time in the case where the line patterns 91 are not tilted. Thus, the delay time corrected with respect to the tilted line patterns 91 is obtained.

Thereafter, each of the electron beams is turned on at the timing designated by the corrected delay time. Thus, it is possible to perform the exposure for the cut patterns at predetermined positions on the tilted line patterns 91.

As described above, according to this embodiment, it is possible to perform the exposure for the cut patterns at accurate positions even in the case of the tilted semiconductor chip 55.

Third Embodiment

This embodiment will describe a method of correcting the delay time when the array beam is tilted.

Figure 9:
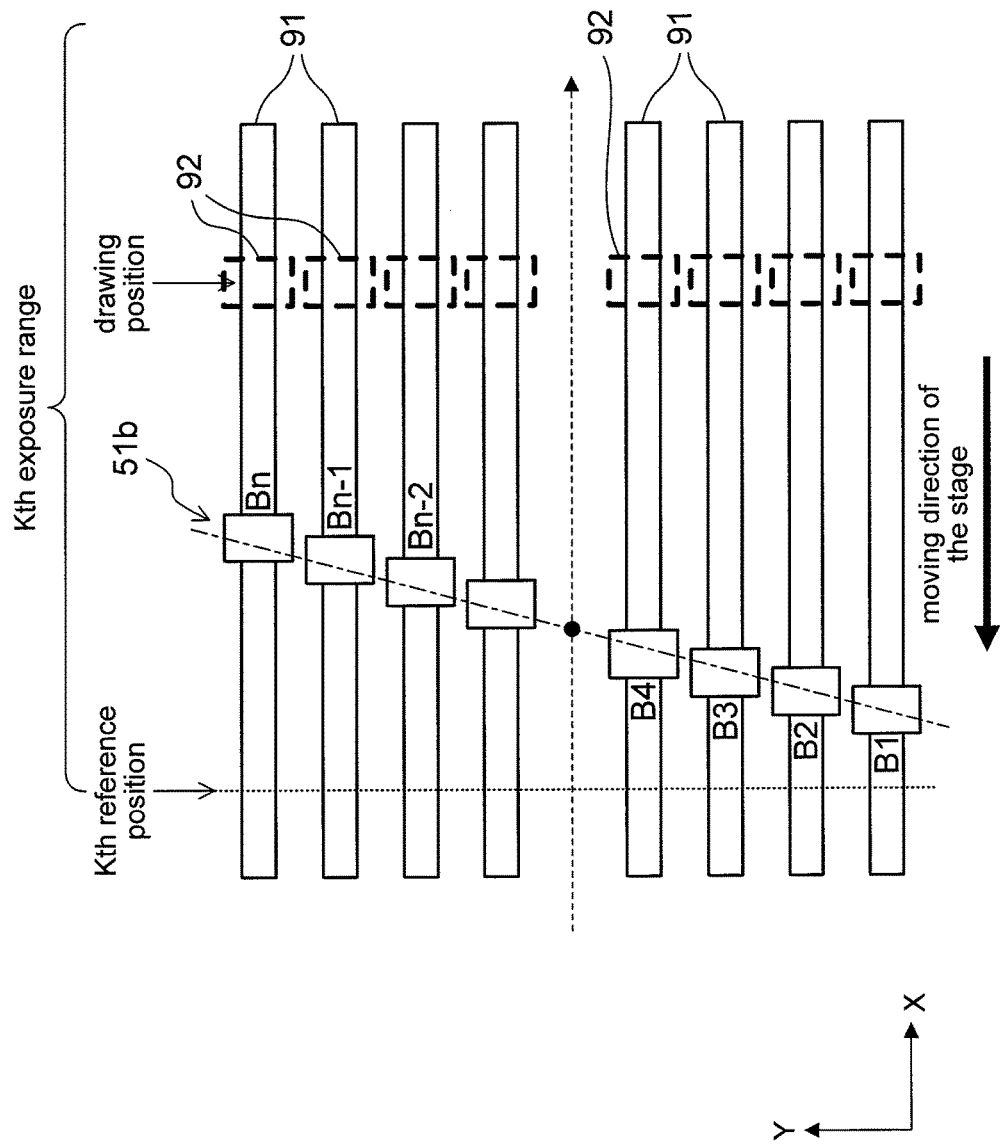
FIG. 9 is a plan view showing irradiated positions when an array beam is tilted.

FIG. 9 is a plan view showing irradiated positions when the array beam is tilted.

The angle in the longitudinal direction of the array beam varies with the lens intensities of the group of electromagnetic lenses 18 of the column unit 10, or with a height of a sample surface. As a consequence, as shown in FIG. 9, the longitudinal direction of the array beam is displaced from the direction orthogonal to the direction of movement of the stage apparatus 21. In this state, it is not possible to perform the accurate exposure at the drawing positions 92 for the cut patterns.

Accordingly, in this embodiment, the tilt of the array beam is measured prior to the exposure.

Figure 10B:
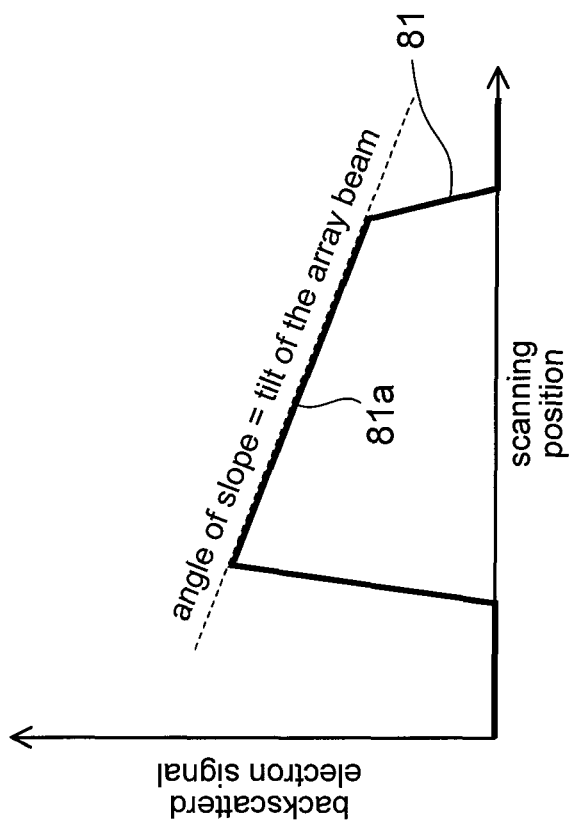
FIG. 10A and FIG. 10B are diagrams showing a method of measuring the tilt of the array beam.
Figure 10A:
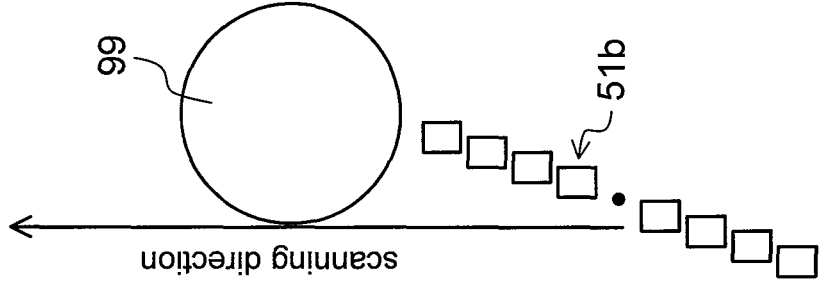

FIG. 10A is a diagram showing a method of measuring the tilt of the array beam, and FIG. 10B is a diagram showing an example of an intensity of a detection signal detected by the method shown in FIG. 10A.

As shown in FIG. 10A, a circular mark pattern 99 is used for measuring the tilt of the array beam. The mark pattern 99 has higher electron reflectivity than that in its surrounding region. Accordingly, a reflection electron signal corresponding to the degree of overlap between the mark pattern 99 and the array beam is obtained when the array beam passes above the mark pattern 99.

Here, the exposure position (the irradiated position) 51b of the array beam is caused to scan in its longitudinal direction by using the feedback deflector 17. As a consequence, a waveform 81 of the reflection electron signal is obtained as shown in FIG. 10B.

When the longitudinal direction of the array beam is tilted with respect to the scanning direction, a slope appears at an upper end 81a of the waveform 81 which represents a relation between the scanning position and reflected electron intensity. The magnitude of the tilt of this slope reflects the tilt of the array beam. Accordingly, the tilt of the array beam can be obtained on the basis of the tilt of the slope.

The tilt of the array beam measured as described above is stored in the correction data storage unit 35.

Thereafter, the delay time arithmetic unit 32 calculates the positional displacement amount of each of the electron beams of the array beam based on the data on the tilt of the array beam. Then, the correction amount δ corresponding to the positional displacement amount is obtained for each of the electron beams, and the correction is performed by adding the correction amount δ to the delay time obtained under the condition that the array beam is not tilted. The method of obtaining the correction amount δ may be the same as the method described in conjunction with FIG. 8.

As described above, according to this embodiment, it is possible to correct the tilt of the array beam.

Fourth Embodiment

This embodiment will describe a method of controlling the delay time when the exposure range to which the pattern belongs does not coincide with an exposure time range.

Figure 11:
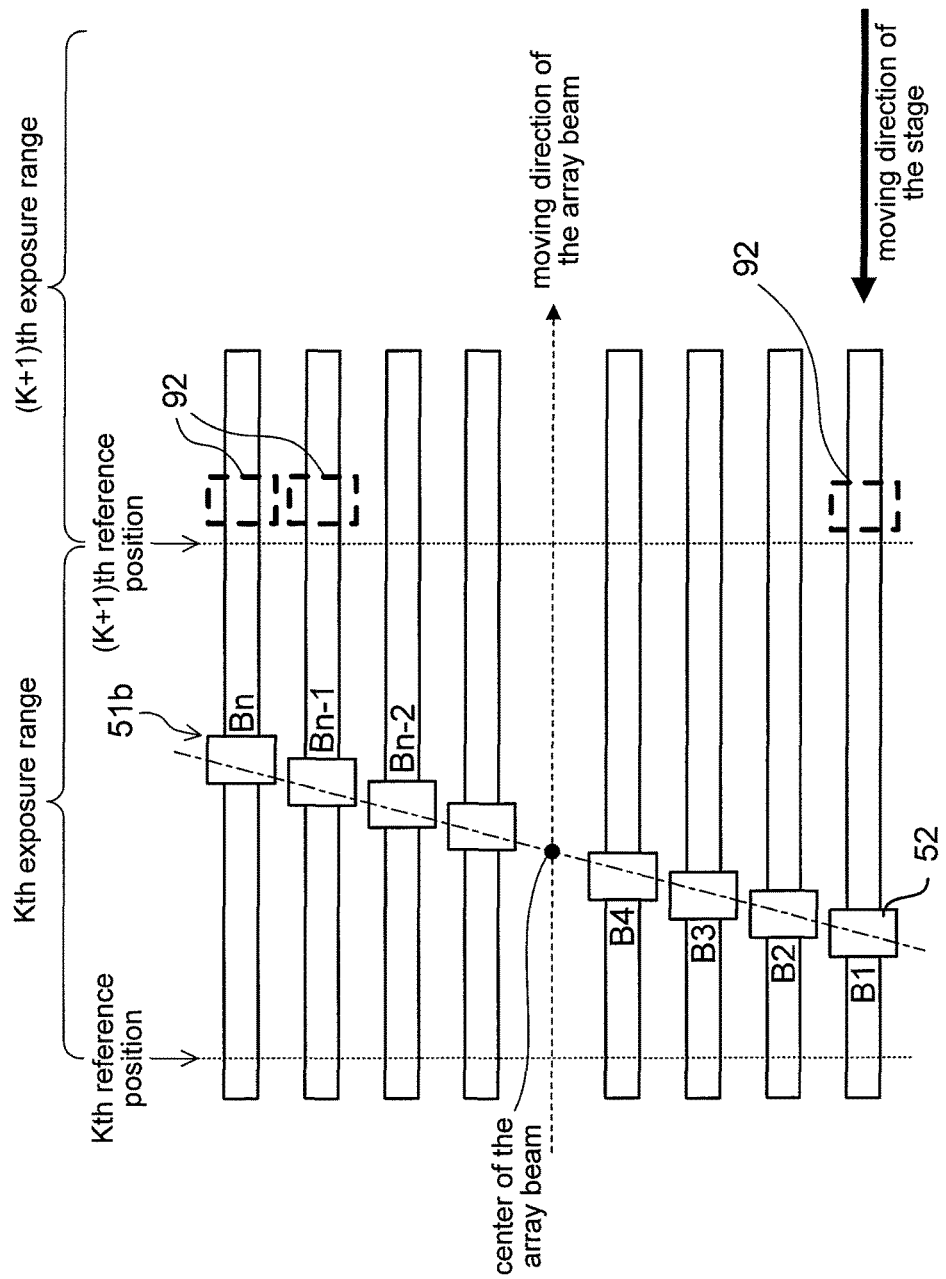
FIG. 11 is a diagram showing a problem when a pattern position is located at a boundary between exposure ranges.

FIG. 11 is a diagram showing a problem when a pattern position is located at a boundary between exposure ranges.

FIG. 11 shows an example in which the positions 92 of the cut patterns are located in the vicinity of a boundary between the exposure ranges. When the line patterns are tilted with respect to the direction of movement of the stage as shown in FIG. 11, the irradiated positions of some electron beams are located at positions shifted back and forth in a traveling direction from the center of the array beam.

For example, regarding the electron beams Bn and Bn−1, exposure timing of the drawing positions 92 belonging to the k+1-th exposure range occurs when the center of the array beam is still located in the k-th exposure range.

Meanwhile, the irradiated positions of the electron beams B1 and B2 are located at positions behind the center of the array beam in terms of the traveling direction. For this reason, the exposure timing of the drawing positions 92 located in the vicinity of a tail end of the k-th exposure range occurs after the center of the array beam enters the k+1-th exposure range.

In this case, processing of the delay time causes confusion.

Figure 12:
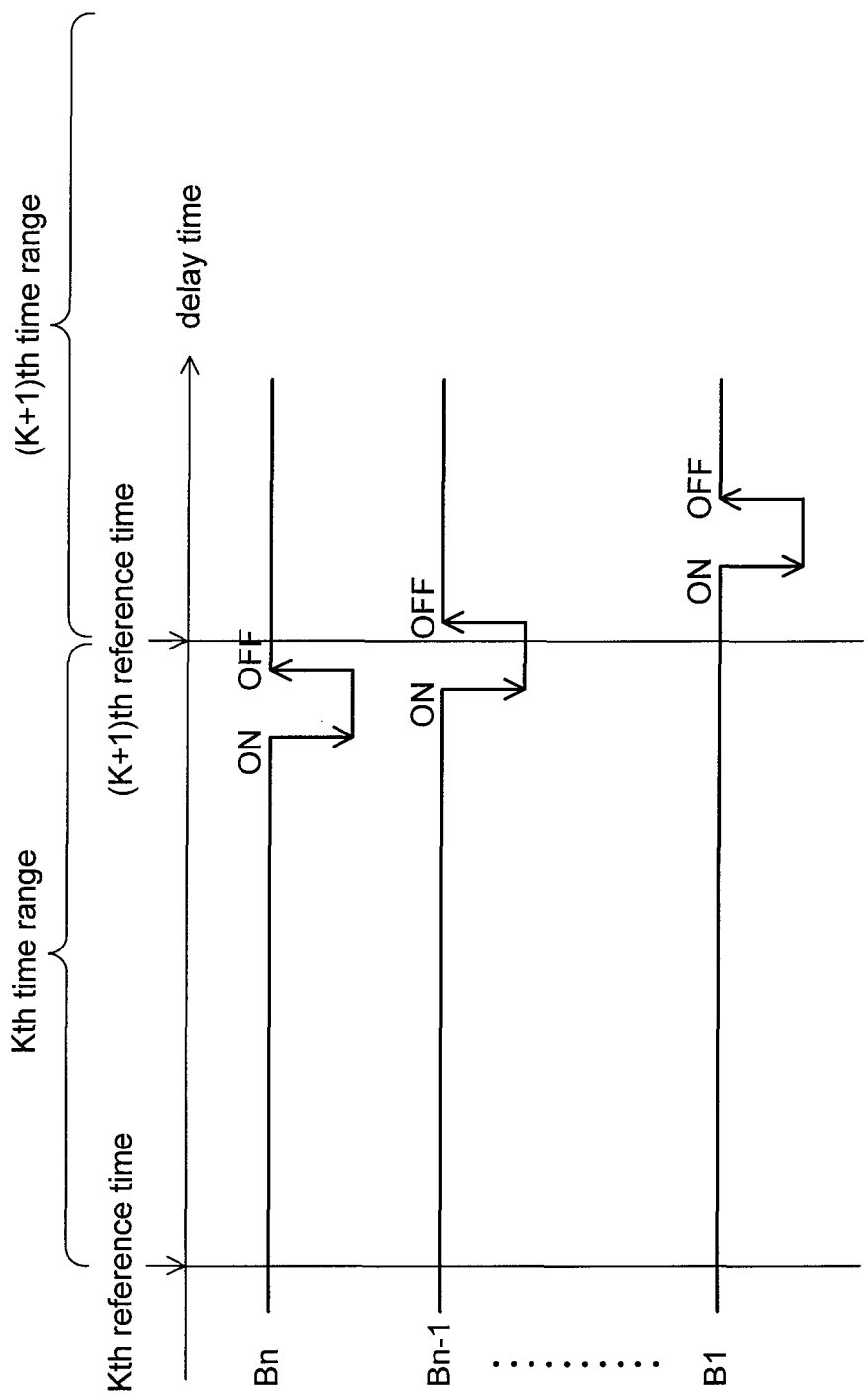
FIG. 12 is a diagram showing a method of controlling blanking timing according to a fourth embodiment.

FIG. 12 is a diagram showing a method of controlling the delay time of this embodiment.

In this embodiment, the delay time arithmetic unit 32 determines whether or not a blanking operation belongs to a different time range as a consequence of the correction of the delay time regarding the tilt of the array beam or the tilt of the line patterns. This determination can be made by checking whether or not the delay time after addition of the difference $\delta_{TDL}$ has a negative value or a value exceeding a maximum value of the exposure time range.

As a result, when the blanking operation is determined to belong to the different time range, the delay time arithmetic unit 32 performs processing for replacing the delay time with delay time corresponding to a time staring point of the adjacent time range.

For example, in FIG. 12, the corrected delay time for each of the patterns for the electron beams Bn and Bn−1 has a negative value. Accordingly, the delay time arithmetic unit 32 performs the processing for replacing the delay time with delay time corresponding to the time starting point of the immediately precedent k-th time range. On the other hand, regarding the pattern for the electron beam B1, the corrected delay time neither has a negative value nor a value exceeding the maximum value of the exposure time range. Accordingly, this pattern is controlled by the delay time corresponding to the k+1-th time starting point.

By performing the processing of this embodiment, even when the delay time is corrected regarding the patterns in the vicinity of the boundary between the exposure ranges, it is still possible to control the blanking operation based on the delay time from the accurate time starting point.

Fifth Embodiment

This embodiment will describe another example of correction of the tilted line patterns 91. In this embodiment, the tilt of the array beam is changed in accordance with the tilt of the line patterns 91, whereby the longitudinal direction of the array beam is corrected to a direction orthogonal to the line patterns 91. Now, the method will be specifically described below.

Figure 13:
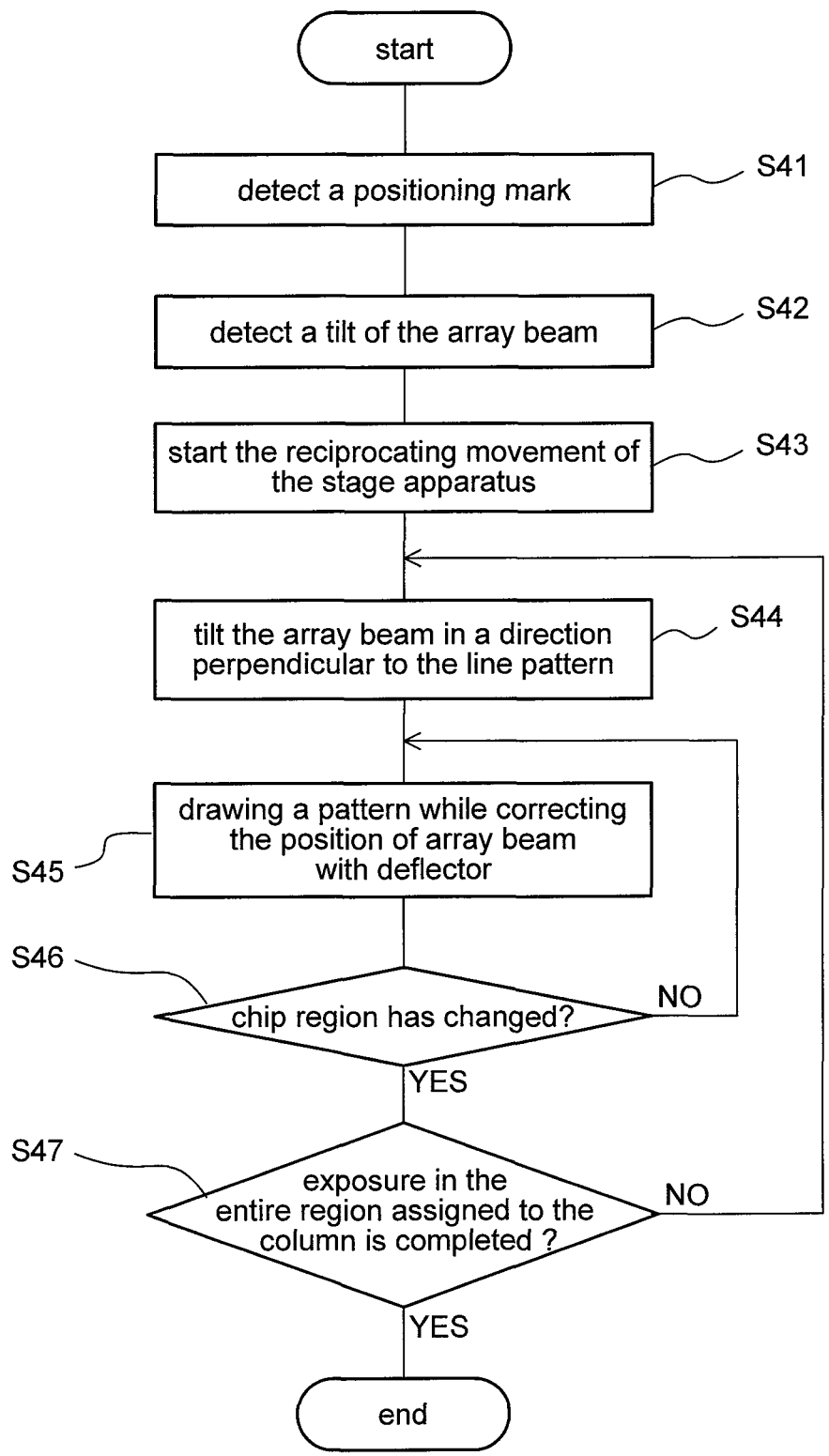
FIG. 13 is a flowchart showing a charged particle beam exposure method according to a fifth embodiment.

FIG. 13 is a flowchart showing a correction method of this embodiment.

In step S41 of FIG. 13, the charged particle beam exposure apparatus 100 detects a positioning mark of a semiconductor chip. Thus, the positional displacement and the tilt of the semiconductor chip are identified and the identified result is stored in the correction data storage unit 35.

Next, the tilt of the array beam is detected in step S42. The method of detecting the tilt of the array beam may be the same as the method described with reference to FIGS. 10A and 10B. Thus, tilt information on the array beam is identified and the identified result is stored in the correction data storage unit 35.

Next, the processing proceeds to step S43 where the reciprocating movement of the stage apparatus 21 is started and the exposure of the patterns is started.

Next, the processing proceeds to step S44 where the information on the tilt of the array beam and the tilt of the line pattern being drawn is extracted from the storage unit 35. Then, the lens drive unit 39 performs angular correction of the array beam by adjusting the lens intensities of the group of electromagnetic lenses 18, thereby aligning the longitudinal direction of the array beam with the direction orthogonal to the line patterns.

Thereafter, in step S45, the exposure of the patterns is performed while correcting the position of the array beam (the position in the direction orthogonal to the direction of movement of the stage) depending on the position of the array beam as well as on the tilt and positional displacement amount of the semiconductor chip.

Next, in step S46, the stage control unit 23 detects whether or not the exposure in one chip region is completed.

When it is determined in step S46 that the exposure in the one chip region is not completed (NO), the processing proceeds to step S45 where the exposure is continued without changing the angle of the array beam.

On the other hand, the processing proceeds to step S47 when it is determined in step S46 that the exposure in the one chip region is completed (YES).

In step S47, the stage control unit 23 determines whether or not the exposure in the entire region assigned to the column is completed. If there is a remaining chip region (NO), the processing proceeds to step S44 where the angle of the array beam is turned to a direction orthogonal to the line patterns of a subsequent chip region. Then, the exposure in the subsequent chip region is performed (steps S45 and S46).

On the other hand, the exposure processing is terminated when the stage control unit 23 determines in step S47 that the exposure in the entire region assigned to the column is completed (YES).

As described above, in this embodiment, the longitudinal direction of the array beam is aligned with the direction orthogonal to the line patterns. Accordingly, no displacement in the direction of the line patterns occurs in terms of the exposure positions of the electron beams B1 to B*n*. For this reason, it is not necessary to correct the delay time for each of the electron beams B1 to B*n* individually.

As mentioned above, this embodiment has an advantage that it is possible to simplify the correction processing.

Sixth Embodiment

Figure 14:
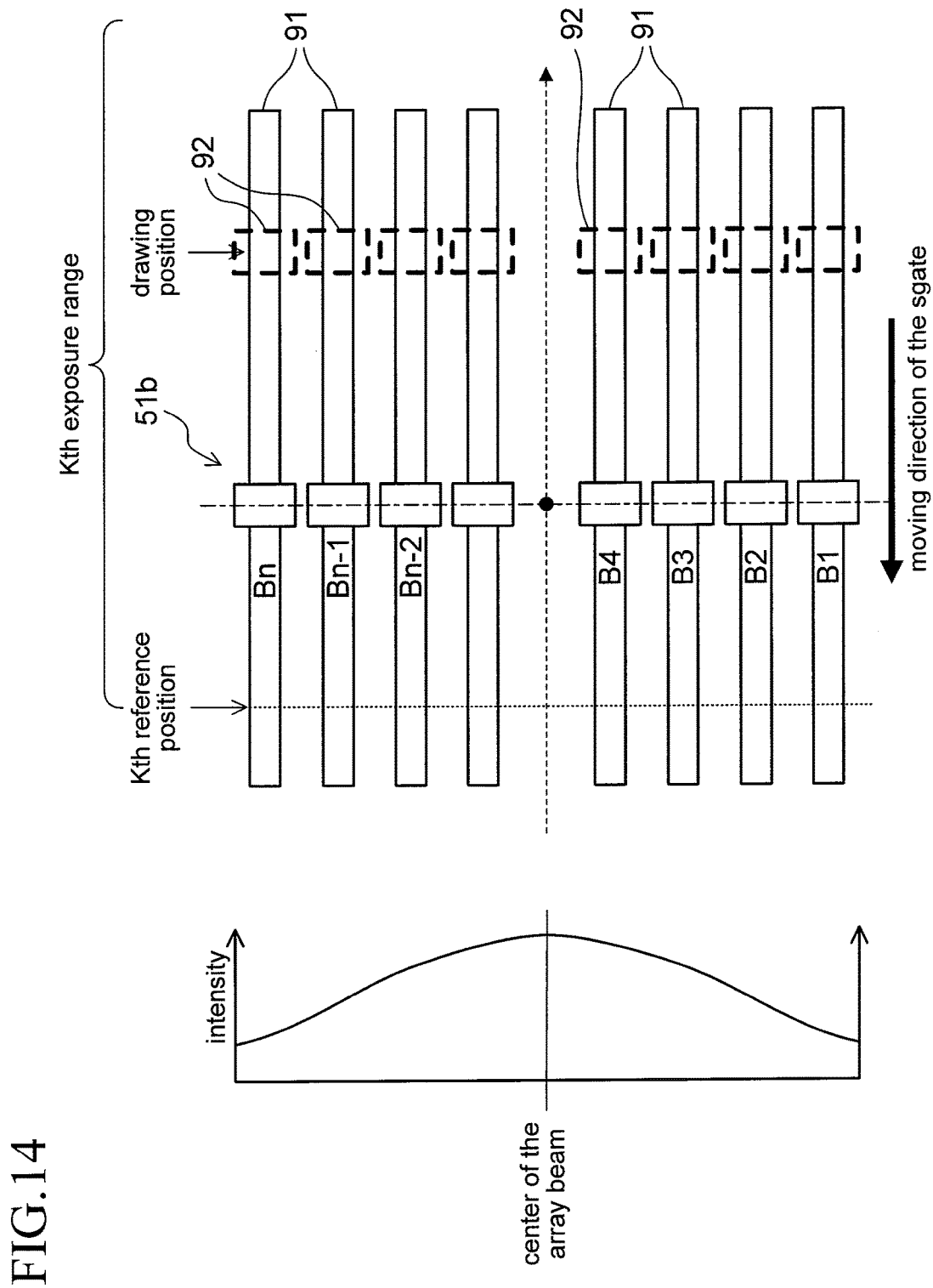
FIG. 14 is a diagram showing a problem when the charged particle beams of the array beam have differences in intensity.

This embodiment will describe a method of correcting differences in intensity among the electron beams in the array beam. FIG. 14 is a diagram showing patterns to be drawn by setting irradiation time of the electron beams constant when there are the differences in intensity among the electron beams of the array beam.

As shown in FIG. 14, the differences in intensity among the electron beams in the vicinity of the center and in the vicinities of end portions of the array beam may occur due to a characteristic of an electro-optical system.

In this case, if all the electron beams are emitted at irradiation time constant in length, a portion of the pattern to be drawn with the electron beam in the vicinity of an end portion where the beam intensity is low can only obtain a pattern in a narrower width than expected due to a small exposure amount.

On the other hand, the electron beam in the vicinity of the center of the array beam may produce the pattern with its width wider than expected due to an increase in the exposure amount.

Figure 15:
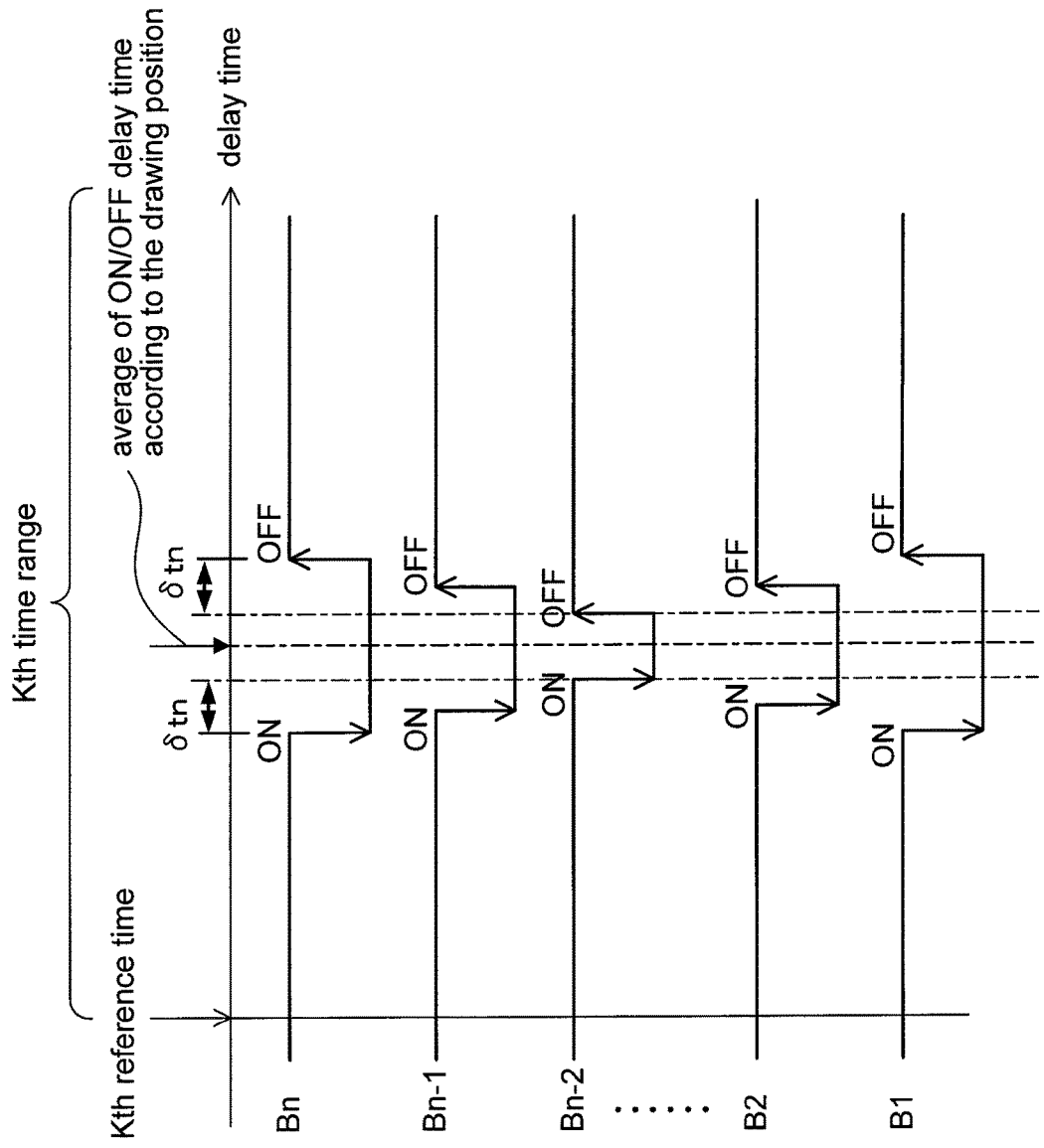
FIG. 15 is a timing chart showing a method of correcting delay time according to a sixth embodiment.

FIG. 15 is a timing chart showing a method of correcting the delay time of this embodiment.

In this embodiment, intensity distribution of the electron beams is obtained by measuring current values of the electron beams in advance. Data on the intensities of the electron beams are stored in the correction data storage unit 35.

Next, the delay time arithmetic unit 32 corrects the delay time as shown in FIG. 15 based on the data on the intensities of the electron beams. Here, a value $-\delta t$ is added to the delay time at on timing of an electron beam with a small current value while a value $\delta t$ is added to the delay time at off timing thereof. Note that the value $\delta t$ is a correction amount of the delay time to be determined depending on the intensity of the electron beam. Thus, it is possible to extend irradiation time of the electron beam without changing an average position of on-off delay time to be determined depending on the position of the cut pattern.

Meanwhile, an electron beam with a high intensity is subjected to processing to reduce its irradiation time by appropriately adjusting the value $\delta t$ applied thereto.

Figure 16:
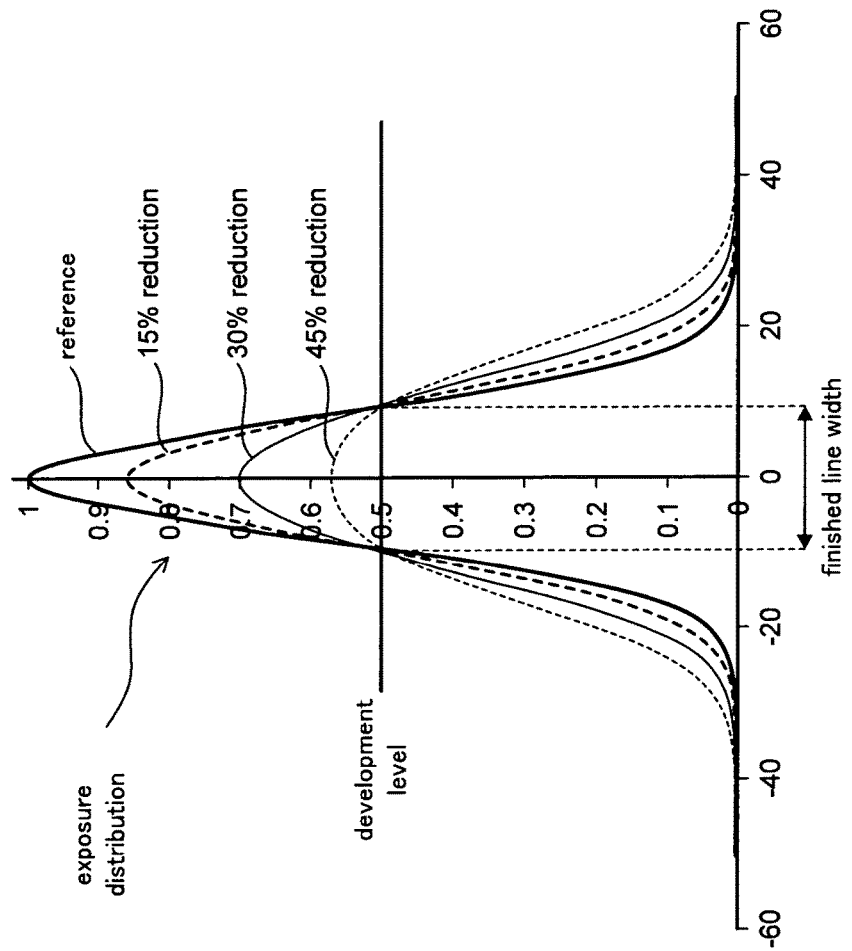
FIG. 16 is a graph showing exposure distribution when irradiation time is changed depending on the intensity of the charged particle beam.

FIG. 16 is a graph showing exposure distribution when the irradiation time is changed depending on the intensity of the electron beam.

In the example shown in FIG. 16, the irradiation time of the electron beam is extended in accordance with an amount of reduction in the intensity of the electron beam, and a spread of each exposure distribution curve reflects the length of the exposure time. A portion where the irradiation amount of the electron beam exceeds a predetermined development level is drawn as a pattern. Here, by appropriately setting the irradiation time, an electron beam which is 45% as high as a standard intensity can obtain a pattern with the same finished line width as that of a pattern formed by exposure at the standard intensity.

Seventh Embodiment

Figure 17:
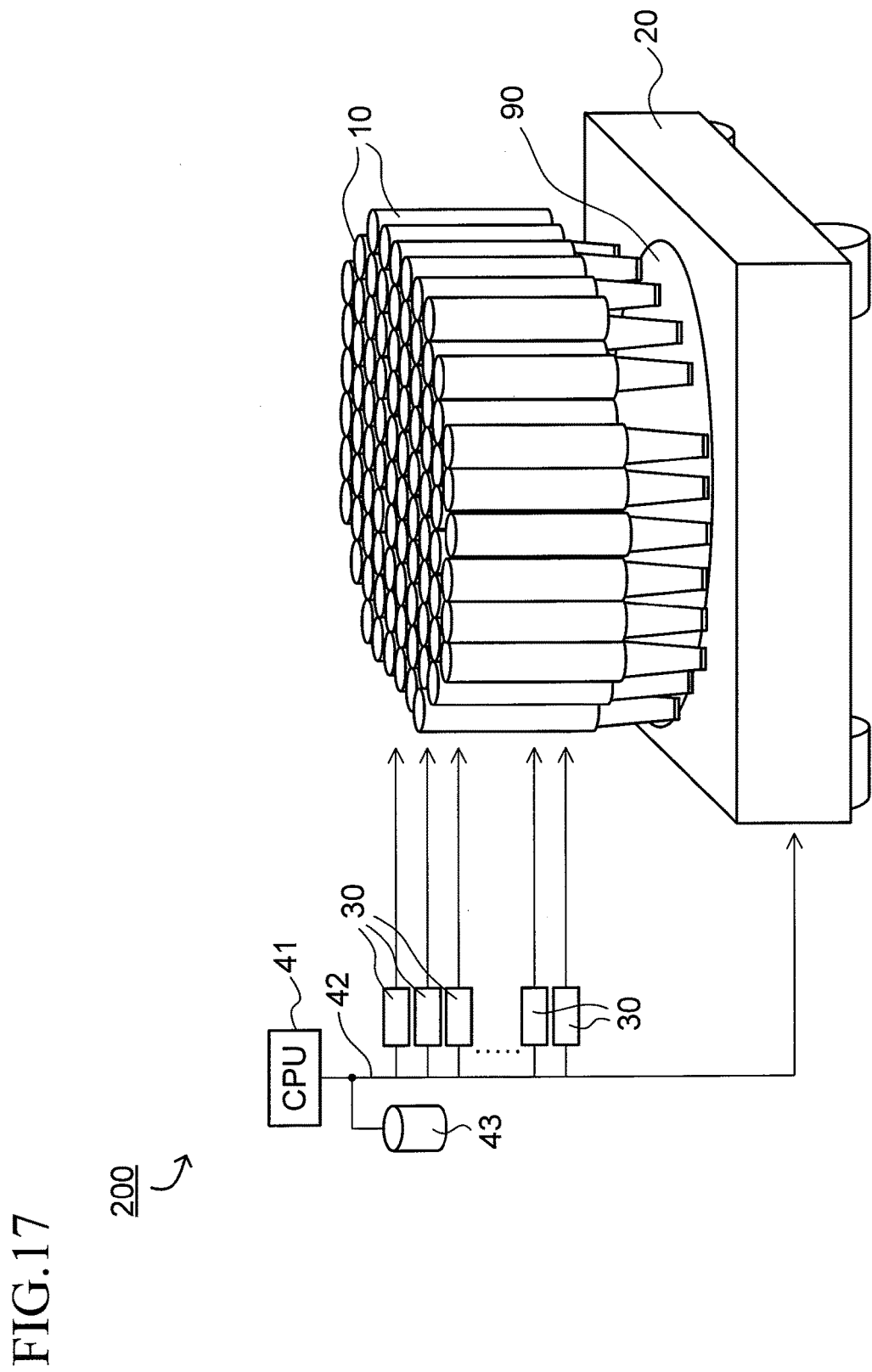
FIG. 17 is a diagram showing column units and a stage of a charged particle beam exposure apparatus according to a seventh embodiment.

FIG. 17 is a diagram showing column units and a stage of an electron beam exposure apparatus according to a seventh embodiment.

As shown in FIG. 17, an electron beam exposure apparatus 200 of this embodiment is formed as an exposure apparatus of a multiple column type in which a plurality of the column units 10 are disposed above the stage unit 20.

An example of performing exposure on a semiconductor wafer (the sample) 90 having a diameter of 300 mm is illustrated in FIG. 17. In this example, each column unit 10 has a diameter of about 30 mm, and column units 10 are disposed above the semiconductor wafer 90. The number of column units 10 is not limited to the foregoing, and may be increased or decreased as appropriate depending on the size of the semiconductor wafer 90.

The column units 10 are provided with the exposure control units 30 (see FIG. 1), respectively, and each exposure control unit 30 controls the corresponding column unit 10. Only one CPU 41 and one external exposure data accumulation unit 43 (see FIG. 1) are provided to the entire electron beam exposure apparatus 200, and are connected to the exposure control units 30 via the bus 42.

Figure 18:
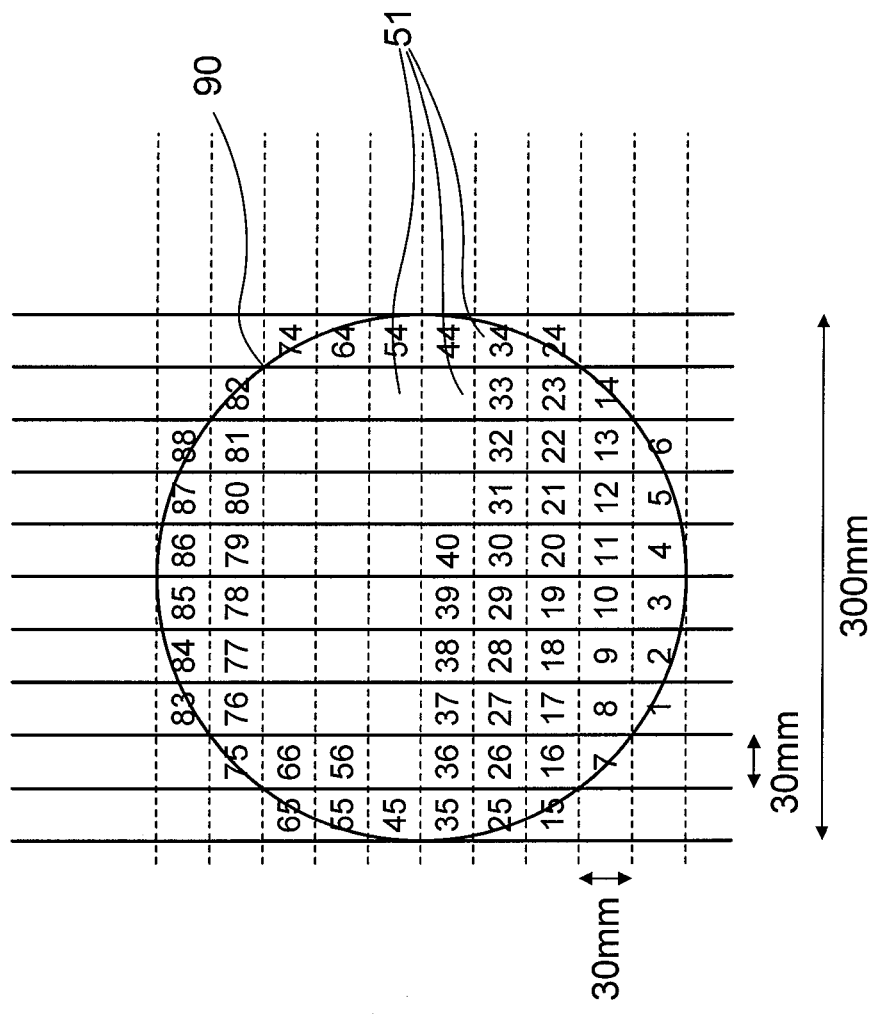
FIG. 18 is a plan view showing a layout of the column units of the charged particle beam exposure apparatus according to the seventh embodiment, and regions where the column units handle the exposure.

FIG. 18 is a plan view showing a layout of the column units 10 and regions assigned to the columns.

As shown in FIG. 18, each column unit 10 performs the exposure in the corresponding region 51 assigned to the column having the size of 30 mm long and 30 mm wide. Numerals 1-88 in FIG. 18 represent numbers of the column units 10 which handle the exposure of the corresponding regions. The semiconductor wafer 90 with the diameter of 300 mm is segmented into 88 regions 51a assigned to the column and are subjected to the exposure.

In the electron beam exposure apparatus 200 of this embodiment, the intensity, the turning angle, the center position of the array beam, and the like may vary among the column units 10.

Accordingly, in this embodiment, the intensity, the turning angle, and the center position of the array beam in each column unit 10 are measured before the exposure is performed, and the deflection amounts and the delay time are corrected by the exposure control units 30 so as to avoid unevenness in the finished patterns among the column units 10.

In addition, the array beam is positioned with respect to the line pattern for each of the column units 10 in order that the plurality of column units 10 perform the exposure of cut patterns which belong to different semiconductor chips.

As described above, according to the electron beam exposure apparatus 200 of this embodiment, the plurality of column units 10 can perform the exposure at the same time. Thus, it is possible to significantly increase exposure throughput.

What is claimed is:

1. A charged particle beam exposure apparatus configured to irradiate a substrate including a plurality of line patterns with a charged particle beam and to perform exposure of a pattern on any of the line patterns, comprising:
 a stage unit capable of holding the substrate and moving the substrate at least in an extending direction of the line patterns;
 a column unit configured to generate an array beam including a plurality of charged particle beams,
 a blanker array included in the column unit and configured to turn each charged particle beam included in the array beam on or off based on a blanking operation signal; and
 an exposure control unit configured to control a position of, the array beam in such a way as to retain the charged particle beams on the line patterns, and to control the blanker array in such a way as to turn each charged particle beam on and off at timing when the charged particle beam arrives at a pattern formation position,
 wherein the exposure control unit acquires exposure data by segmenting an exposure region in a direction of movement of the substrate into a plurality of exposure ranges each with predetermined length and calculates the delay time by dividing a distance between the reference position and the pattern by a moving velocity of the stage unit.

2. The charged particle beam exposure apparatus according to claim 1, further comprising:
 a delay time arithmetic unit configured to calculate timing to turn each charged particle beam on and off based on delay time starting from a point of time when the array beam passes through a reference position set in the exposure region.

3. The charged particle beam exposure apparatus according to claim 2, wherein the delay time arithmetic unit corrects the delay time of each charged particle beam included in the array beam based on tilt of the line patterns on the substrate and tilt of the array beam.

4. The charged particle beam exposure apparatus according to claim 3, wherein the tilt of the line patterns is determined based on an alignment mark of a device chip disposed on the substrate.

5. The charged particle beam exposure apparatus according to claim 2, wherein the delay time arithmetic unit corrects the delay time depending on an intensity of each charged particle beam included in the array beam.

6. The charged particle beam exposure apparatus according to claim 1, further comprising:
 a feedback deflector configured to correct an exposure position of the array beam; and
 a deflection amount determination unit configured to calculate a deflection amount of the feedback deflector necessary to cause the exposure position of the array beam to follow the line patterns by using the feedback deflector.

7. The charged particle beam exposure apparatus according to claim 1, further comprising:
 a group of electromagnetic lenses included in the column unit and configured to adjust a focal position of the array beam; and
 a lens drive unit configured to adjust the focal position and a turning angle of the array beam by combining drive signals to be applied to the group of electromagnetic lenses.

8. The charged particle beam exposure apparatus according to claim 1, further comprising:
 a gauge configured to detect an irradiated position of the array beam on the substrate.

9. The charged particle beam exposure apparatus according to claim 1, comprising:
 a plurality of the column units; and
 a plurality of the exposure control units, wherein
 the charged particle beam exposure apparatus performs exposure in parallel by using the plurality of the column units.

10. A charged particle beam exposure method to be performed by a charged particle beam exposure apparatus provided with
 a stage unit configured to hold a substrate and to move the substrate in an extending direction of line patterns,
 a column unit configured to generate an array beam including a plurality of charged particle beams arranged side by side in a direction intersecting the line patterns in order to irradiate the line patterns,
 a blanker array included in the column unit and configured to turn each charged particle beam included in the array beam on or off based on a blanking operation signal, and
 an exposure control unit configured to control components of the column units,
 the method comprising:
 causing the exposure control unit to control an exposure position of the array beam in such a way as to cause exposure positions of the charged particle beams included in the array beam to move on and along the line patterns, causing the exposure control unit to turn each charged particle beam on and off at timing when the charged particle beam arrives at a pattern formation position, causing the exposure control unit to acquire exposure data by segmenting an exposure region in a direction of movement of the substrate into a plurality of exposure ranges each with a predetermined length, and causing the exposure control to calculate timing to turn each charged particle beam on and off based on delay time starting from a point of time when the array beam passes through a reference position set in the exposure region.

11. The charged particle beam exposure method according to claim 10, further comprising:

causing the exposure control unit to calculate the delay time by dividing a distance between the reference position and a pattern by a moving velocity of the stage unit.

12. The charged particle beam exposure method according to claim 10, further comprising:

causing the exposure control unit to correct the delay time of each charged particle beam included in the array beam based on tilt of the line pattern on the substrate and tilt of the array beam.

13. The charged particle beam exposure method according to claim 10, further comprising:

causing the exposure control unit to correct the delay time depending on an intensity of each charged particle beam included in the array beam.

* * * * *